(12) United States Patent
Nizar et al.

(10) Patent No.: US 6,252,821 B1
(45) Date of Patent: Jun. 26, 2001

(54) METHOD AND APPARATUS FOR MEMORY ADDRESS DECODE IN MEMORY SUBSYSTEMS SUPPORTING A LARGE NUMBER OF MEMORY DEVICES

(75) Inventors: Puthiya K. Nizar, El Dorado Hills; Michael W. Williams, Citrus Heights, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,570

(22) Filed: Dec. 29, 1999

(51) Int. Cl.$^7$ ..................................................... G11C 8/00
(52) U.S. Cl. .................................. 365/238.6; 365/238.5; 365/233.01; 395/421.07; 395/428; 345/521
(58) Field of Search ...................... 365/230.01, 230.06, 365/238.5; 395/421.07, 428; 345/521

(56) References Cited

U.S. PATENT DOCUMENTS

| | | | |
|---|---|---|---|
| 5,317,704 | * | 5/1994 | Izawa et al. ........................ 395/400 |
| 5,335,334 | * | 8/1994 | Takahashi et al. .................... 395/425 |
| 5,440,705 | * | 8/1995 | Wang et al. ....................... 395/421.1 |
| 5,649,146 | * | 7/1997 | Riou ................................. 395/421.07 |
| 6,157,398 | * | 12/2000 | Teddeloh ............................. 345/521 |

* cited by examiner

*Primary Examiner*—Viet Q. Nguyen
(74) *Attorney, Agent, or Firm*—Blakely, Sokoloff, Taylor & Zafman LLP

(57) ABSTRACT

One embodiment of the invention is a method for decoding a memory access address. A portion of the memory access address is compared to a plurality of boundary values, each of the plurality of boundary values representing an uppermost address for a group of memory devices, each of the memory devices in the group having the same configuration. A group number is generated that represents an addressed group that contains an addressed memory device that contains the memory access address. A device number is generated that represents the location of the addressed memory device within the addressed group. A device selection signal is generated responsive to the group number and the device number.

24 Claims, 9 Drawing Sheets

METHOD AND APPARATUS FOR MEMORY ADDRESS DECODE IN MEMORY SUBSYSTEMS SUPPORTING A LARGE NUMBER OF MEMORY DEVICES

BACKGROUND

1. Field of the Invention

This invention relates to data communications in a computer system, and more specifically, to decoding of memory access addresses to produce memory device signals.

2. Background Information

Computer systems generally include at least a central processing unit and a memory subsystem that stores instructions and data to be used by the central processing unit. Many computer systems will also include other subsystems, such as input/output subsystems, that can also read and write data from the memory subsystem. In a flat memory architecture, the memory subsystem is accessed as a collection of data units each of which has a unique address.

Most memory devices cannot directly receive a memory access address as presented by the central processing unit. Therefore, the memory subsystem includes a memory controller that provides a bridge between the memory devices and the other portions of the computer system.

One function of the memory controller is to receive the memory access address directed to the memory subsystem and the decode the memory access address to produce the address signals as required by the memory devices. The size of the memory subsystem is often larger than the size of a single memory device in the memory subsystem. Therefore, part of the memory access address is used to select a particular memory device within the memory subsystem and another part of the memory access address is used to select a data unit from within the memory device.

The memory subsystem must be able to respond to memory access requests quickly to avoid slowing down the central processing unit and other subsystems within the computer system. This requires that a memory access address be quickly decoded to produce the necessary signals to access the requested data unit from the appropriate memory device. One aspect of the decoding process is determining the memory device that contains the requested data unit. This is necessary not only to generate the necessary signals to access the appropriate memory device but also to determine what addressing signals are required to access the data unit within the selected memory device. A memory subsystem may contain a variety of memory devices with different sizes, different organizations of data units, and different addressing requirements.

In some prior art memory subsystems, boundary address registers are used to determine the memory device that contains the requested data unit. The prior art memory subsystems are generally limited to having eight or fewer memory devices. Thus the number of boundary address registers required was also limited to eight or less.

Demands for increasingly larger memory subsystems have led to designs, such as the Direct Rambus™ memory channel architecture, that can include a much larger number of memory devices than the prior art memory subsystems. For example, a Direct Rambus™ memory channel can have up to 32 memory devices. A single memory subsystem can include multiple memory channels increasing the number of memory devices even further. If a data boundary register is provided for every possible memory device in a memory subsystem that supports a large number of memory devices, the decode logic will take a significant length of time to identify the memory device.

SUMMARY

One embodiment of the invention is a method for decoding a memory access address. A portion of the memory access address is compared to a plurality of boundary values, each of the plurality of boundary values representing an uppermost address for a group of memory devices, each of the memory devices in the group having the same configuration. A group number is generated that represents an addressed group that contains an addressed memory device that contains the memory access address. A device number is generated that represents the location of the addressed memory device within the addressed group. A device selection signal is generated responsive to the group number and the device number.

DETAILED DESCRIPTION

The present invention provides a method and apparatus to quickly decode a memory access address to identify a memory device in a memory system that supports a large number of memory devices.

Figure 1:
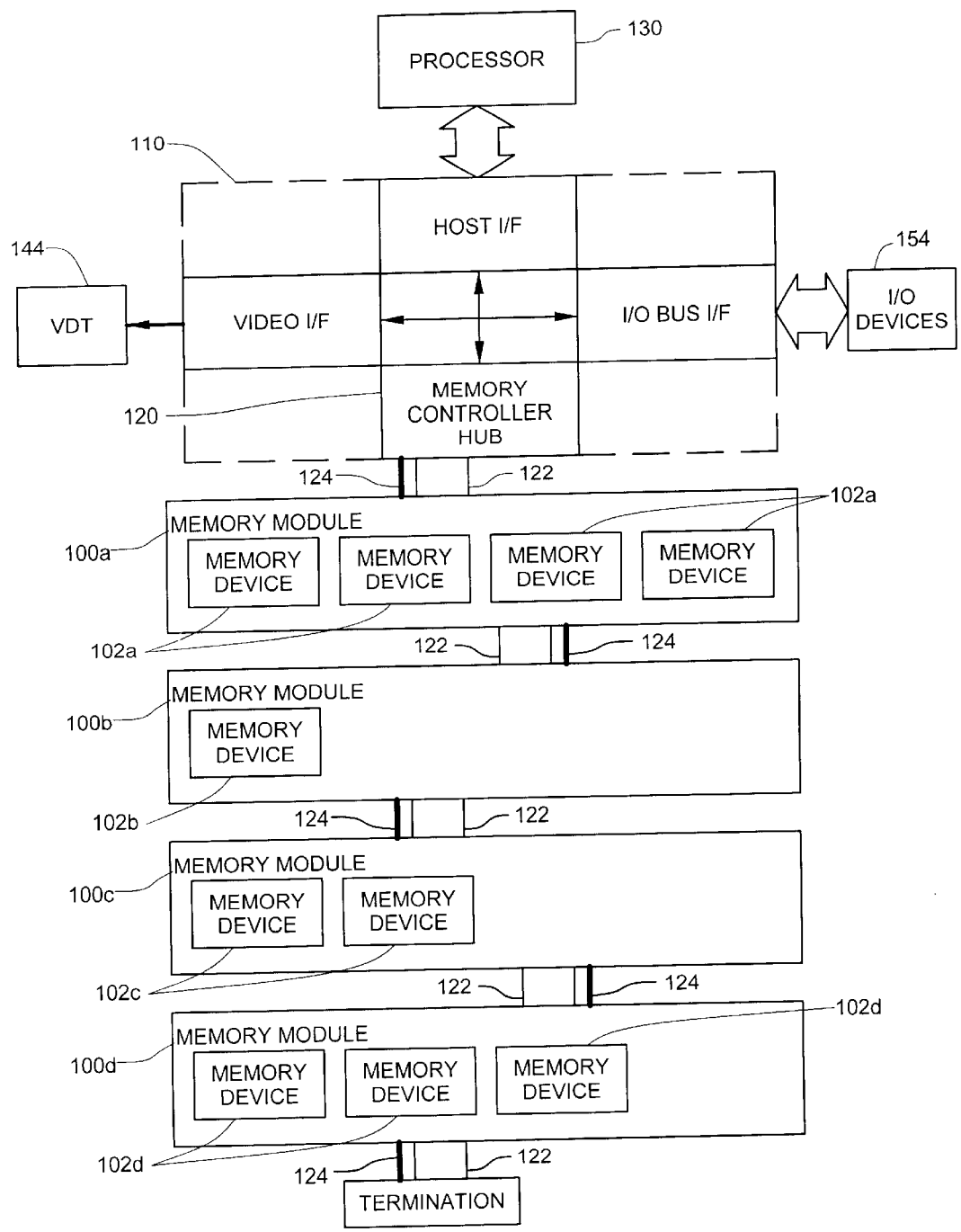
FIG. 1 is a block diagram of a computer system that includes an embodiment of a memory subsystem according to the invention.

FIG. 1 shows an exemplary computer system that uses an embodiment of the present invention. A bridge unit 110 provides interconnections between a memory subsystem and a processor 130, a video display terminal 144, and I/O devices 154. The memory subsystem includes a memory bus 122, 124, memory devices 102 coupled to the bus, and a memory controller hub 120 coupled to the bus. The memory controller hub 120 portion of the bridge unit provides the interface to the memory subsystem.

The memory subsystem illustrated in FIG. 1 uses a memory channel type memory bus to provide data transfers between the memory devices 102 and the memory controller hub 120. An example of a memory channel bus interface would be a Rambus® interface. The interface includes a parallel bus 122 that provides data and command transfers and a serial bus 124 that provides configuration parameters. The memory devices 102 may be physically mounted on memory modules 100 to allow a number of memory devices to be conveniently connected to the memory bus.

The memory subsystem can include memory devices with differing configurations. For example, a first group of memory devices 102a may have a lower memory capacity than another group of memory devices 102b. All the memory devices on one memory module will normally have the same configuration. For example, all the memory devices 102a on the first memory module 100a will have a first configuration which may or may not be the same as the configuration of memory devices on another module. This requires the memory controller hub 120 to identify the memory device that will service a specific memory request and generate a device selection signal as appropriate for the memory device based on its configuration.

Figure 2:
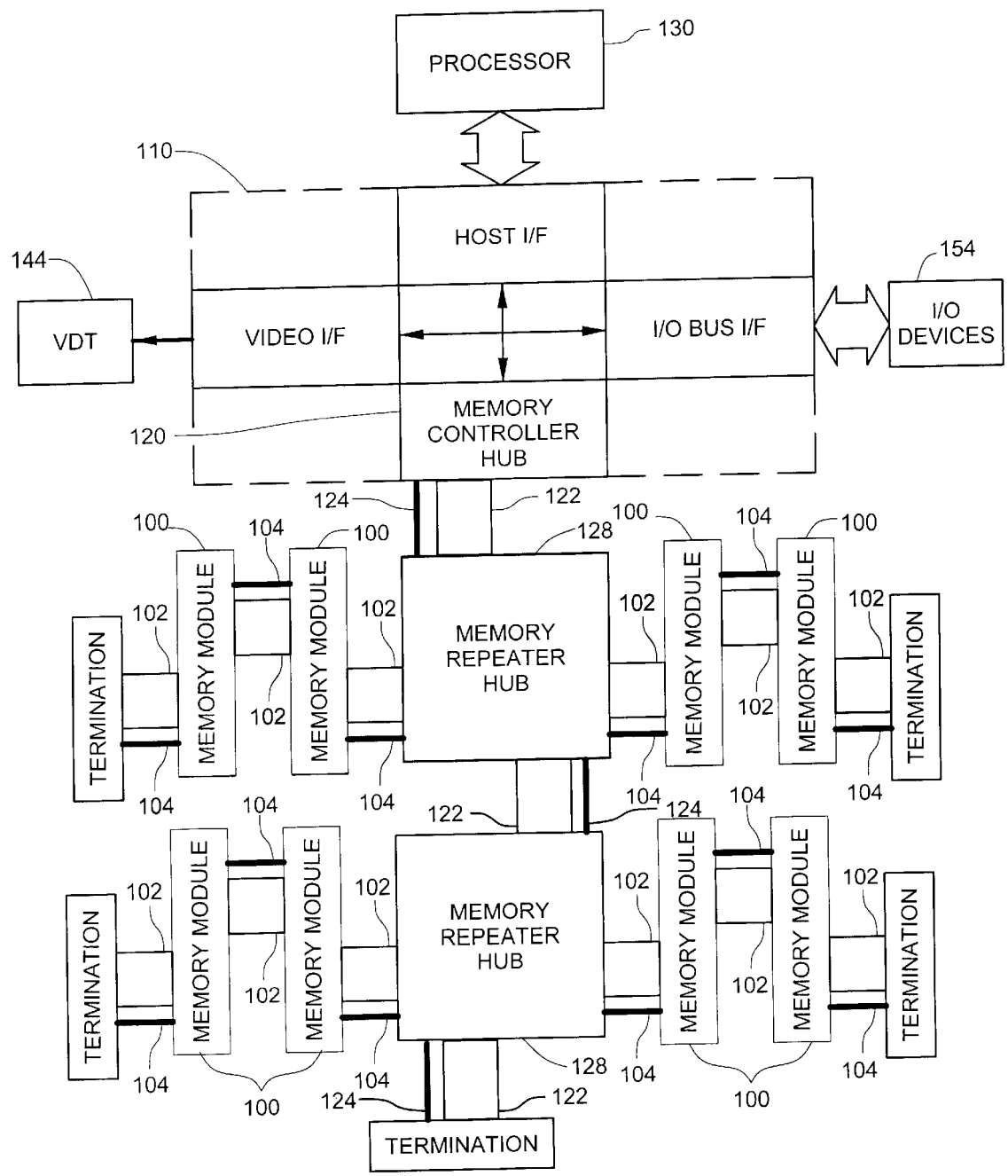
FIG. 2 is a block diagram of another embodiment of a memory subsystem according to the invention.

FIG. 2 shows another exemplary computer system that uses an embodiment of the present invention. In this memory subsystem, memory repeater hubs 128 are used to support multiple memory channels 102, 104. This requires the memory controller hub 120 to identify the channel that the required memory device is on and generate a channel selection signal for the channel in addition to generating the device selection signal on the appropriate channel.

Figure 3:
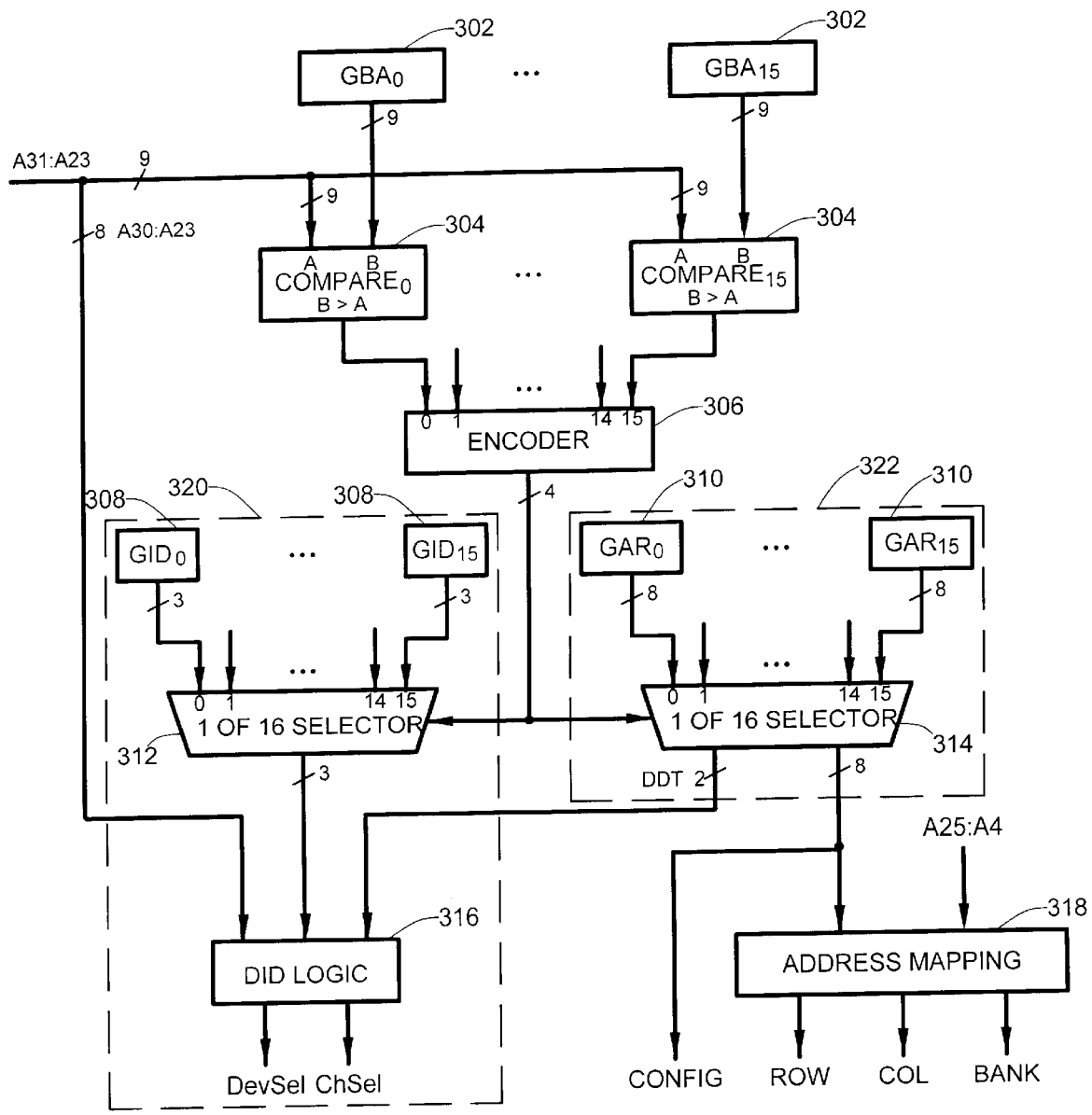
FIG. 3 is a block diagram of an embodiment of a memory address decode circuit.

FIG. 3 shows an embodiment of a memory address decode circuit according to the present invention. This circuit would be a portion of the circuitry in the memory controller hub 120 of FIG. 1 or FIG. 2. The circuit receives a memory access address, A31:A0, for a data transaction in the memory subsystem. The memory address decode circuit generates the signals necessary to access the addressed data.

A memory access address is generally capable of addressing many more locations than can be contained on a single memory device. The address can be viewed as containing two portions. A first portion of the address selects a memory device and a second portion of the address selects a location within the memory device. It will be appreciated that the number of bits in the second portion of the memory access address is dependent on the size of the memory device. It is a function of the memory address decode circuit to select the appropriate bits for the first and second portions of the address.

In the description of the invention, the memory access address bits will be described as using the high order bits for the first portion of the memory access address and the low order bits for the second portion of the memory access address. It will be appreciated that the invention is not limited to any particular assignment of specific address bits to a specific addressing portion. In many memory subsystems it will be advantageous to use the memory access address bits provided to the memory controller hub in a nonconsecutive order in which consecutive addresses result in accessing different memory devices. It is to be understood that the memory access address bits as presented to the memory address decode circuit may have been previously re-ordered from the memory access address bits presented to the memory controller hub. The term "memory access address" as used herein means the address bits as received by the memory address decode circuit.

The memory address decode circuit according to the invention manages the memory devices as a number of groups of memory devices where the number of groups is a power of 2. Each group may contain up to a predetermined maximum number of memory devices where the maximum number is a power of 2. All the memory devices within a group must have the same configuration. A group may be empty and contain no memory devices.

The memory address decode circuit includes three sets of registers to manage the groups of memory devices. Each set has a number of registers equal to the number of groups. In the embodiment shown in FIG. 3 the circuit manages 16 groups of memory devices. The Group Boundary Address (GBA) registers 302 hold a boundary value representing an uppermost address for one of the groups of memory devices.

In one embodiment the boundary value is a portion of the uppermost address in the group plus 1. Those address bits required to address a location within the smallest supported memory device can be omitted from the boundary value. The Group Identification (GID) registers 308 hold group identification values used to generate the signals that select a memory device. In one embodiment of the invention, the GID and GBA are maintained together in one 16 bit register as follows:

| Bit Field | Default and Access | Description |
| --- | --- | --- |
| [15:14] | 00b RW | Channel ID (CHID) - Reflects the ID of the RAMBus channel described by this GBA entry |
| [13:11] | 000b RW | Group ID (GID) - Value that indicates the RDRAM group described by this GBA entry |
| [10:0] | 001h RW | Group Boundary Address (GBA) - Address that indicates the upper bound of this GBA entry when compared against bits [33:24] of the requested address. Note that the largest valid value is 400h. |

The Group Attribute Registers (GAR) 310 hold attribute values that represent configuration parameters for the memory devices in the group. In one embodiment of the invention, the GAR is used as follows:

| Bit Field | Default and Access | Description |
| --- | --- | --- |
| [7:6] | 10b RW | Device Page Size (DPS) - This field defines the page size of the each device in the corresponding group. |
| [5] | 0b RW | Reserved |
| [4:3] | 00b RW | Device Banks (DB) - This field defines the number of banks in each device in the corresponding group. |
| [2:1] | 00b RW | Device DRAM Technology (DDT) - This field defines the DRAM technology of each device in the corresponding group. |
| [0] | 0b RO | Reserved |

The bit field definitions for DPS are as follows:

| Encoding | RDRAM Description | SDRAM Description |
| --- | --- | --- |
| 0 0 | Reserved | 4 KBytes |
| 0 1 | Reserved | 8 KBytes |
| 1 0 | 1 KBytes | 16 KBytes |
| 1 1 | 2 KBytes | 32 KBytes |

The bit field definitions for DB are as follows:

| Encoding | Description |
| --- | --- |
| 0 0 | 16d (16) Banks |
| 0 1 | 2 × 16d (32) Banks |
| 1 0 | 4l (4) Banks |
| 1 1 | Reserved |

The bit field definitions for DDT are as follows:

| Encoding | Description |
|---|---|
| 0 0 | 64 Mbit Technology |
| 0 1 | 128 Mbit Technology |
| 1 0 | 256 Mbit Technology |
| 1 1 | 512 Mbit Technology |

A portion of the memory access address is compared to each of the GBA registers 302 by a number of comparators 304 equal to the number of GBA registers. Each comparator generates a comparison signal. In one embodiment the comparison signal is generated if the GBA value is greater than the portion of the address compared. A priority encoder 306 receives the output of all the comparators and generates a group number that is a binary value representing the lowest numbered comparator which generated a comparison signal. The group number is thus the lowest numbered group for which the associated boundary value is larger than the corresponding portion of the address of the memory location and represents an addressed group that contains an addressed memory device that contains the memory location.

The group number from the priority encoder 306 is provided as an input to two 1 of n selectors 312, 314. In the embodiment illustrated n is 16. It may be observed that the encoder could provide an "address out of range" output if there is no GBA that is greater than the address. However, a typical computer system will detect and handle out of range addresses before they reach the memory address decode circuit. In such systems, the memory address decode circuit can assume that the address presented is valid.

A first selector 314 is used to select the GAR 310 for the group containing the memory device 102 that contains the addressed data in a group attribute circuit 322. An attribute value from the GAR is supplied to an address mapping logic block 318 along with low-order address bits, A25:A0. Based on the attribute value, an appropriate number of the low-order bits are used to provide ROW, COL, and BANK signals to the memory device that contains the addressed data. For example, a memory device may provide data in multibyte units, such as 16 bytes, and therefore not use the low-order address bits, such as the low-order 4 bits. Such a device of a 64 Mbit size will use address bits A22:A4 for memory accesses and address bits A27:A23 to select a device. A 512 Mbit memory device will use address bits A25:A4 for memory accesses and address bits A30:A26 to select a device.

A second selector 312 is used to select the GID register for the group containing the memory device 102 that contains the addressed data in a device selection circuit 320. The GID and a portion of the GAR that defines the memory device size are supplied to a Device ID (DID) logic block 316 along with high-order address bits, A27:A23. Based on the memory device size, the DID logic determines a device number that represents the memory device within the group containing the addressed data. In one embodiment, the device number is a number of bits selected from the memory access address. The number of bits selected is based on a predetermined maximum number of memory devices in a group and the position of the bits selected is based on the size of memory devices in the group. The device number and the GID are used to generate a device selection signal (DevSel) to select the memory device that contains the addressed data. In one embodiment, a portion of the GID is concatenated with the device number to form a device selection value that is used to generate DevSel. In a memory subsystem that has multiple channels, the GID is also used to generate a channel selection signal (ChSel) to select the channel having the required memory device. In one embodiment, a portion of the GID is a channel selection value that is used to generate the channel selection signal.

The register values will typically be initialized as part of the power-on sequence for the computer system. The initialization routine may be a computer program provided to the computer system as data signals which may be embodied in a computer memory, on computer-readable media, or a carrier wave. In one embodiment, a software routine in the basic input/output system (BIOS), which may be stored in a read-only memory (ROM), performs the required initialization.

Figure 4:
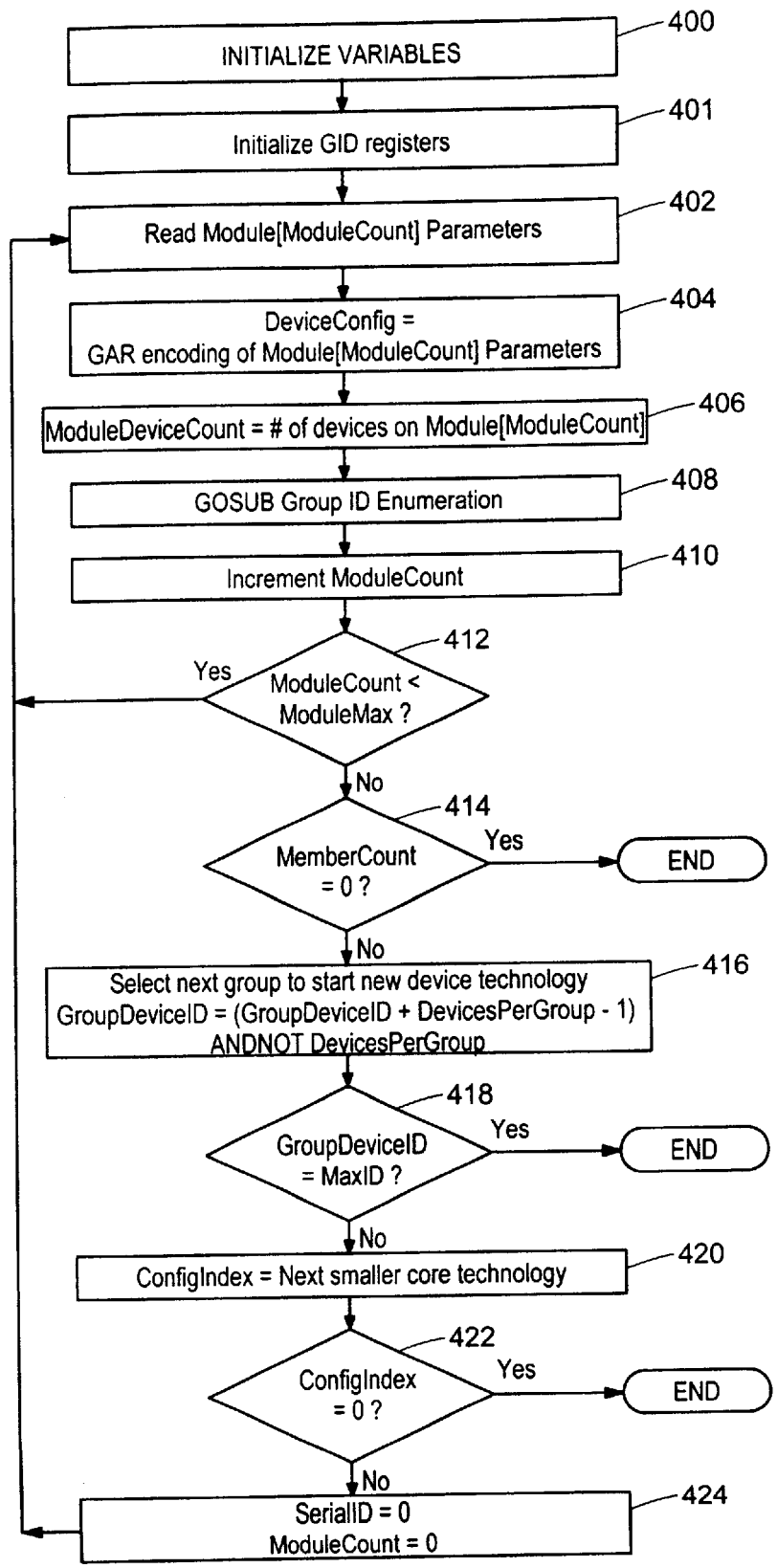
FIG. 4 is a flowchart of an embodiment of a computer program for initializing the memory devices and memory address decode circuit registers.

FIG. 4 illustrates a flowchart for one embodiment of a computer program for initializing the register values of the memory address decode circuit. The program begins by initializing a number of program variables 400. The variable MemberCount is set to the total number of devices on the memory channel being initialized. The initialization routine has a configuration table containing all supported memory device configurations. In one embodiment, the table is ordered by device size with the largest device first. The variable ConfigIndex is an index to the configuration table that is initialized to point to the largest memory device.

In some embodiments, memory devices provide configuration information on a serial bus. The serial bus can also be used to set parameters in the memory device. Memory devices are addressed on the serial bus by the relative position on the bus. The variable SerialID is used to identify a memory device to be accessed by the initialization routine. SerialID is initialized to 0. Each memory device includes a DeviceID register that can be set through the serial bus with a value that the memory device will recognize as identifying memory access requests directed to the device. The initialization program maintains the variable GroupDeviceID, initialized to 0, for setting the DeviceID registers.

The memory devices are typically mounted on modules with all devices on one module having the same configuration. In a memory subsystem that uses memory modules the initialization program will read device configurations on a module by module basis and initialize all the devices on the module iteratively. The variable ModuleCount, initialized to 0, maintains a count of the memory module being initialized.

The memory address decode circuit provides for a predetermined number of memory devices per group. In one embodiment, the number of devices per group is configurable. For example, the maximum number of devices per channel may be 32 and up to 4 channels may be supported. The memory address decode circuit can have a single channel and a multi-channel mode. In single channel mode the circuit might provide for 8 groups with 4 devices per group. In multi-channel mode the circuit might provide for 16 groups, 4 groups per channel, with 8 devices per group. It will be understood by those skilled in the art that numerous other configurations are possible within the spirit and scope of this invention. The initialization routine maintains the maximum number of memory devices per group as DevicesPerGroup and the maximum number of grouped memory devices per channel as MaxID. It may be observed that MaxID is independent of MemberCount because the number of memory devices that can physically be present on the channel, MemberCount, may result in partially populated groups that results in a maximum GroupDeviceID that is larger than MemberCount. Therefore, MemberCount is used to detect when all possible physical devices have been initialized and MaxID is used to detect when all possible group positions have been populated.

The GID registers are set 401 to provide values used to generate the device signal and, in multi-channel mode, the channel select signal. In one embodiment for a single channel mode, the GID is value is the same as the register number. In one embodiment for a multi-channel mode, the GID value includes a channel ID and a device ID as follows:

| GID # | ChID | DevID | GID |
|---|---|---|---|
| 0 | 0 | 0 | b'00 000' |
| 1 | 0 | 8 | b'00 001' |
| 2 | 0 | 16 | b'00 010' |
| 3 | 0 | 24 | b'00 011' |
| 4 | 1 | 0 | b'01 000' |
| 5 | 1 | 8 | b'01 001' |
| 6 | 1 | 16 | b'01 010' |
| 7 | 1 | 24 | b'01 011' |
| 8 | 2 | 0 | b'10 000' |
| 9 | 2 | 8 | b'10 001' |
| 10 | 2 | 16 | b'10 010' |
| 11 | 2 | 24 | b'10 011' |
| 12 | 3 | 0 | b'11 000' |
| 13 | 3 | 8 | b'11 001' |
| 14 | 3 | 16 | b'11 010' |
| 15 | 3 | 24 | b'11 011' |

It may be noted that in this embodiment, the DevID portion of the GID is the upper bits of the device identification value. The lower bits of the device identification are generated by the DID logic block 316 based on the memory access address and the device size. It may also be noted that three bits are provided for the DevID portion of the GID to support a single channel mode in which the DevID value ranges from 0 to 7 to support 8 groups of 4 devices per group.

The configuration parameters for the memory module being initialized, Module[ModuleCount], are read 402. The parameters may include memory device size, rows per device, columns per device, banks per device, and a flag indicating dependent or independent banks. The variable DeviceConfig is set to a value based on the configuration parameters read 404. The value of DeviceConfig may be the encoded value as maintained in the GARs 310. The variable ModuleDeviceCount is set to the number of devices on the memory module being initialized 406.

Figure 5:
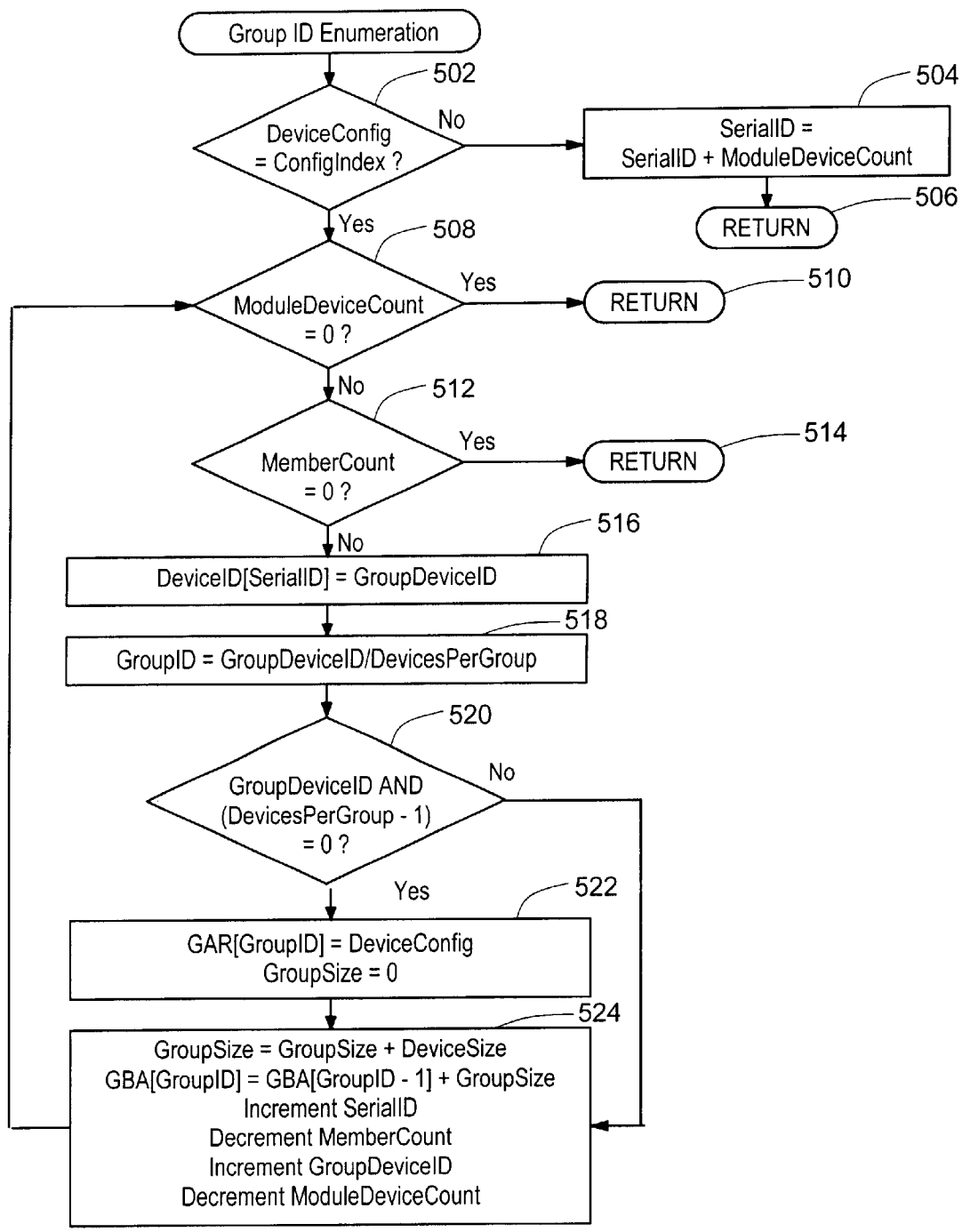
FIG. 5 is a flowchart of a subroutine for the computer program shown in FIG. 4.

A Group ID Enumeration subroutine, as shown in FIG. 5, is then called to perform the register initialization for the memory address decode circuit 408. Group ID Enumeration begins by comparing DeviceConfig and ConfigIndex to determine if the parameters of the memory device match the pre-selected parameters selected by ConfigIndex 502. If not, SerialID is increased by ModuleDeviceCount 504 and control returns to the main routine 506. If the memory devices have the configuration indicated by Configindex, then the Group ID Enumeration proceeds with initialization of the registers in the memory address decode circuit.

Register initialization is performed in a loop that begins by testing ModuleDeviceCount for a zero value 508. If ModuleDeviceCount is zero, then all devices on the memory module have been initialized and control returns to the main routine 510. Otherwise, MemberCount is tested for a zero value 512. If MemberCount is zero, then all devices on the channel have been initialized and control returns to the main routine 510.

The DeviceID register for the memory device being initialized, DeviceID[SerialID], is set to the value of Group-DeviceID 516. GroupID is set equal to GroupDeviceID/DevicesPerGroup where the division is integer division that truncates the result. Therefore, if GroupDeviceID is equal to 3 and DevicesPerGroup is 4, GroupID will be set to 0.

The GroupDeviceID is tested to determine if the first memory device in a group is being initialized 520. This is done by testing the low order bits that represent the device number within the group for a zero value. When the first device in a group is initialized, the GAR for that group is set to the device configuration of the first device and a GroupSize variable is reset to zero 522.

For every memory device initialized, a register initialization block 524 is performed. GroupSize is increased by DeviceSize. The GBA, GroupSize, and DeviceSize values are maintained in units of the smallest memory configuration supported. Therefore, DeviceSize will be 1 for the smallest device. The GBA for the current group is set to the GBA for the previous group plus the GroupSize. GBA[−1], the GBA of the "previous group" to the first group is specially recognized as having the value 0. It may be observed that a GBA may be set several times as memory devices are added to a group. SerialID is incremented to point to the next memory device. MemberCount is decremented to count all physical devices on the channel. GroupDeviceID is incremented to point to the next member of the memory group. ModuleDeviceCount is decremented to count the memory devices on the module. Control is then transferred to the ModuleDeviceCount test 508 to perform another iteration of the device initialization. Initialization continues until all devices on the module have been initialized 508 or until all devices supported on the memory channel have been initialized 512.

The main routine then increments ModuleCount 410 and tests to see if there are additional modules to be read 412. After all modules are read, MemberCount is tested to see if all devices supported on the channel have been initialized 414. If not, GroupDeviceID is set to the starting device number for the next memory group 416 and the resulting GroupDeviceID is tested to determine if all available group positions have been assigned 418. If not, ConfigIndex is set to point to the next smaller device configuration 420 and the resulting ConfigIndex is tested to determine if all support memory configurations have been initialized 422. If not, SerialID and ModuleCount are reset to zero 424 to start a new scan of all memory devices 402. When all memory devices have been assigned to groups and initialized, any GBAs that remain uninitialized are set to the value of the preceding initialized GBA.

FIGS. 6A–6D illustrate the initialization of memory devices and the registers of a memory address decode circuit in an embodiment of the invention. The example shown is for a memory decode circuit configured to use 8 groups with up to 4 devices per group on a single memory channel. The memory subsystem in the example is populated with two memory modules 610, 620. The first memory module 610 on the memory channel is populated with 4 memory devices 600*a*–600*d* with each memory device having a memory capacity of 64 Mbits. The second memory module 620 on the memory channel is populated with 6 memory devices 600*e*–600*j* with each memory device having a memory capacity of 128 Mbits.

Each memory device includes a first register 604, such as an INIT register, that includes a serial device identification that has been previously initialized by the relative position of the memory device on a serial bus. It may be observed that the values progress from '00' in the top left device 600*a* to '09' in the lower left device 600*j* in a serpentine fashion to suggest a memory channel that begins at the top of the left edge of the memory module 610, looping through the module to end at the bottom of the left edge and then continue in a like manner on the second module.

Each memory device further includes a second register 602, such as a DEVID register, that includes a value that is compared with a device identification value during a memory access to select the appropriate memory device. The value in the second register is undefined prior to the execution of the memory address decode circuit initialization routine as indicated by 'XX'.

The memory address decode circuit illustrated includes 8 sets of registers 630 numbered 0 to 7. The GID register contains the binary value of the group identification. This value matches the register number because only a single channel is being supported.

Figure 6A:
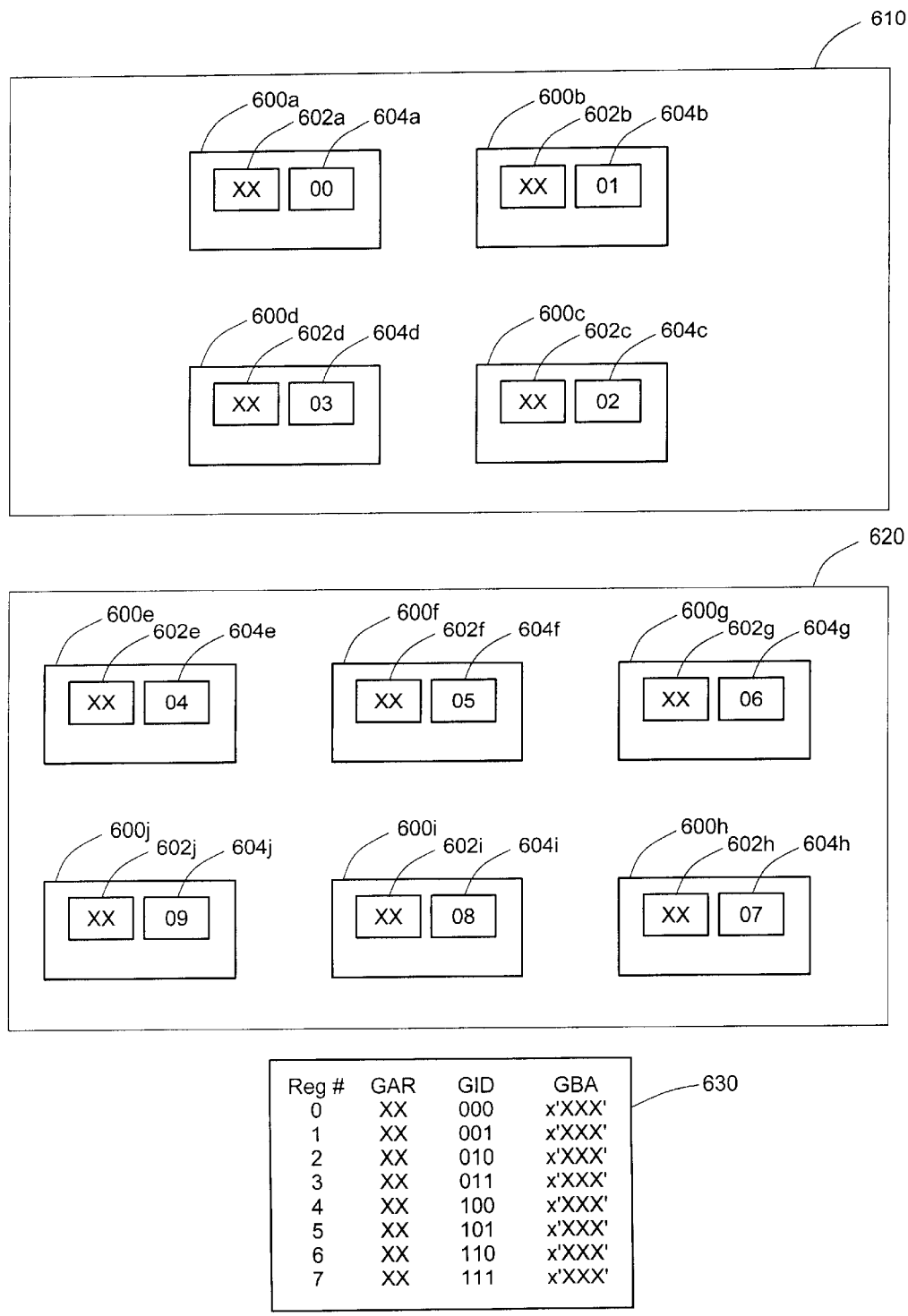
FIGS. 6A to 6D are illustrations of the initialization of an exemplary memory subsystem and memory address decode circuit registers.
Figure 6B:
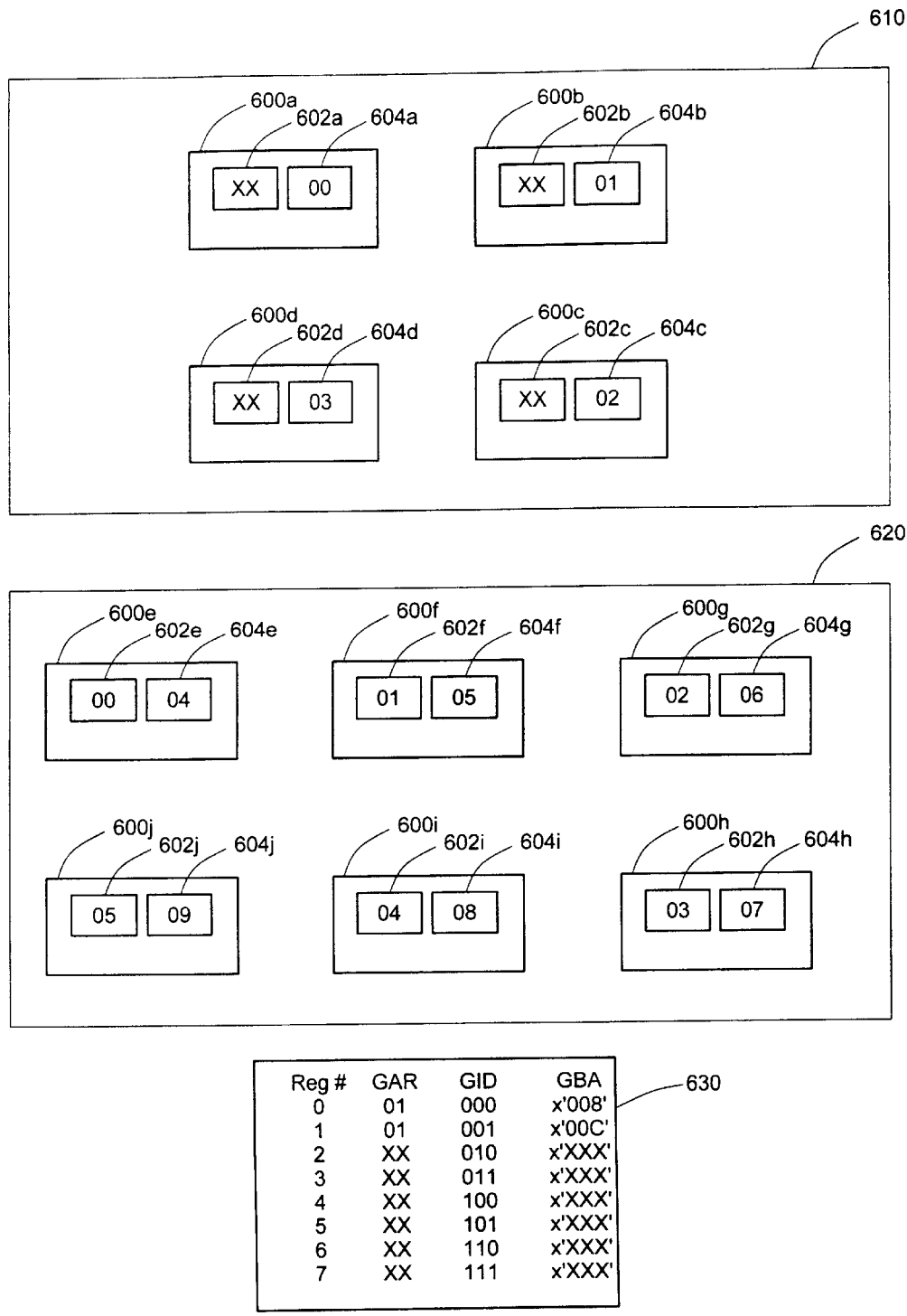

FIG. 6B illustrates the initialization of the first two memory groups. The second memory module 620 will be initialized first because the memory devices 600e–600j on this module are larger than the memory devices on the first memory module 610.

After initializing the program variables 400 and the GID registers 401, the parameters for the first module 610 will be read 402 from the first memory device 600a since it responds to SerialID 0 604a. The parameters are encoded and DeviceID is set to 0 in this embodiment since the memory devices 600a–600d are a 64 MBit technology 404. The ModuleDeviceCount is set 406 to 4 and the Group ID Enumeration subroutine is called 408. The DeviceConfig will not equal ConfigIndex 502 since a larger configuration is being initialized. Therefore, SerialID will be incremented by ModuleDeviceCount 504 to the value of 4 and the subroutine will return 506.

The parameters for the second module 620 will be read 402 from the fifth memory device 600e since it responds to SerialID 4 604e. The parameters are encoded and DeviceID is set to 1 in this embodiment since the memory devices 600e–600j are a 128 MBit technology 404. The ModuleDeviceCount is set 406 to 6 and the Group ID Enumeration subroutine is called 408. The DeviceConfig will equal ConfigIndex 502 since this is the largest configuration being initialized. (This may not occur on the first iteration if the circuit supports larger configurations.)

The tests of ModuleDeviceCount 508 and MemberCount 512 will both fail. DeviceID[4] 602e will be set to GroupDeviceID 516 which will be 0. The variable GroupID is set to GroupDeviceID/DevicesPerGroup 518 which is 0/4 or 0.

GroupDeviceID is tested to determine if we are initializing the first device in a group 520 which we are. GAR[0] is set to Device Config which is 1 630 and the variable GroupSize is initialized to zero 522.

We then perform the initialization 524 of the memory address decode registers 630 for the memory device 600e. GroupSize is incremented by the DeviceSize. The GBA is in units of the smallest supported memory device, 8 megabytes in this example. The memory device being initialized has a size of 16 megabytes so DeviceSize and therefore GroupSize is 2. GBA[0] is set to GBA[-1], which is always 0 as a boundary condition, plus GroupSize or 2. GBA[0] will be reset each time GroupSize is increased. SerialID is incremented to have a value of 5 which points to the next memory device 600f. MemberCount is decremented to count all physical devices on the channel and now has a value of 31. GroupDeviceID is incremented to point to the next member of the memory group and now has a value of 1. ModuleDeviceCount is decremented to count the memory devices on the module and now has a value of 5. We then return to the ModuleDeviceCount test 508 to perform another iteration of the device initialization.

The tests of ModuleDeviceCount 508 and MemberCount 512 will both fail. DeviceID[5] 602f will be set to GroupDeviceID 516 which is now 1. The variable GroupID is set to GroupDeviceID/DevicesPerGroup 518 which is 1/4 or 0 because the division is an integer division. The first device in group test will fail 520 and the routine proceeds directly to the register initialization 524. GroupSize is incremented and now has a value of 2+2 or 4. GBA[0] is set to GBA[-1]+4 or 4. The variables are incremented and decremented as in the previous iteration.

When the fifth device 600i on the module is initialized GroupDeviceID will be 4 and GroupID will advance to 4/4 or 1. The start of group test 520 will succeed, GAR[1] will be set to 1, and GroupSize will be reset to zero 522. The registers will be initialized as for previous devices 524.

After the sixth device 600j is initialized 524, ModuleDeviceCount will be decremented to zero and the ModuleDeviceCount test will succeed 508 and the subroutine will return 510. ModuleCount will be incremented 410 and, if there were additional modules with the configuration indicated by ConfigIndex, the additional modules would be initialized. When all possible modules of the current configuration have been initialized, MemberCount is tested to determine is all possible devices on the channel have been initialized 414. If not, GroupDeviceID is forced to the value for the start of the next group 416. This can create partial groups if the number of devices of a given configuration is not an exact multiple of DevicesPerGroup as is the case in this example. GroupDeviceID has a value of 6. It is set to (6+4−1) ANDNOT 4 which is the value 8. As a result, GroupDeviceID values 6 and 7 will not be assigned to any memory device.

GroupDeviceID is tested to determine if all possible group positions are filled 418 which will fail. ConfigIndex is set to the next smaller memory configuration 420, in this example by decrementing to select the 64 Mbit configuration. ConfigIndex is tested to determine if all supported memory configurations have been initialized 420, which at this point will fail. SerialID and ModuleCount are reset to 0 to start a new scan of all memory devices.

Figure 6C:
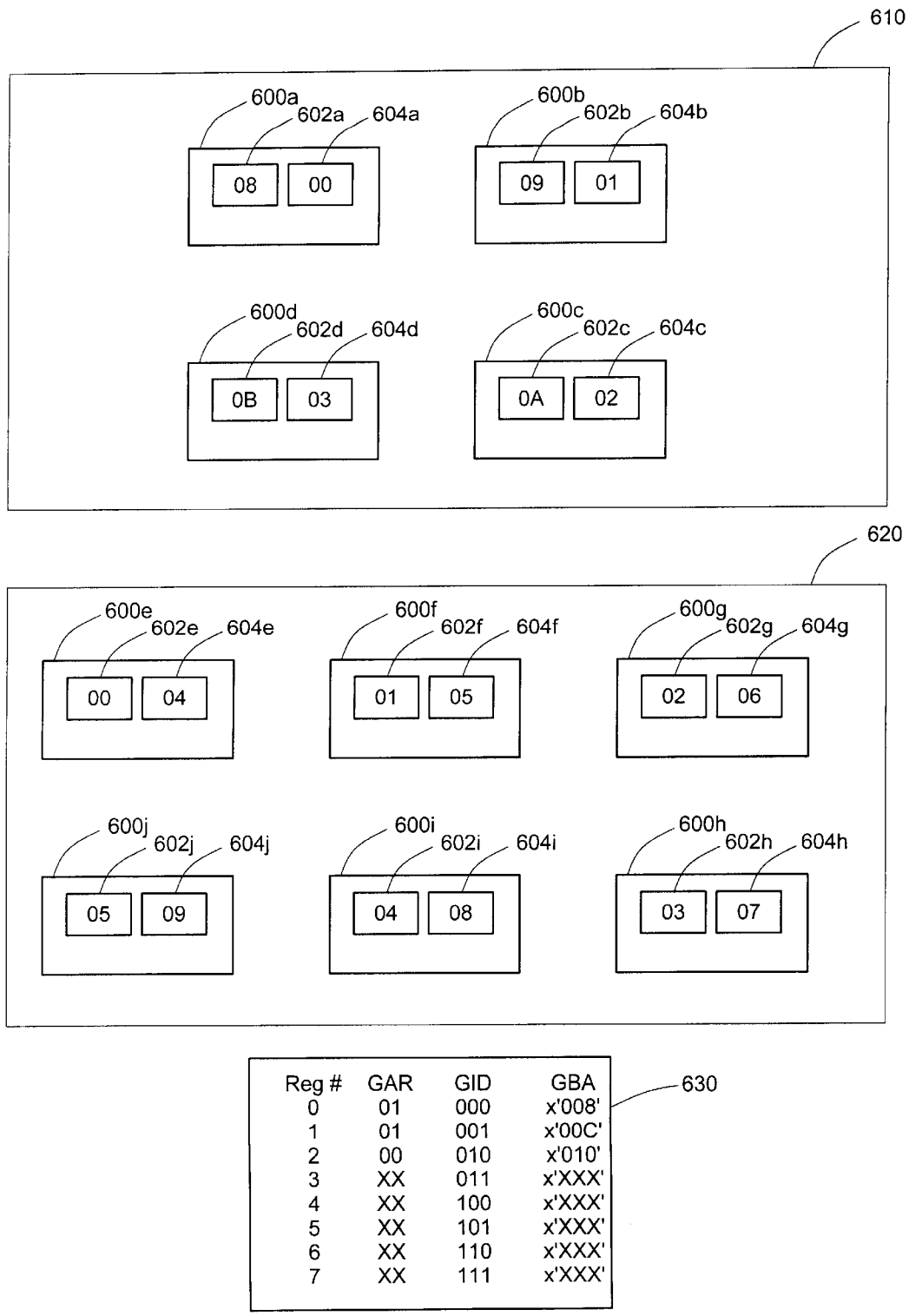

FIG. 6C shows the condition of the memory devices 600 and the memory address decode circuit registers 630 after the second pass of device initialization. Following the second pass, the test of ConfigIndex 422 will succeed ending the initialization of memory devices.

Figure 6D:
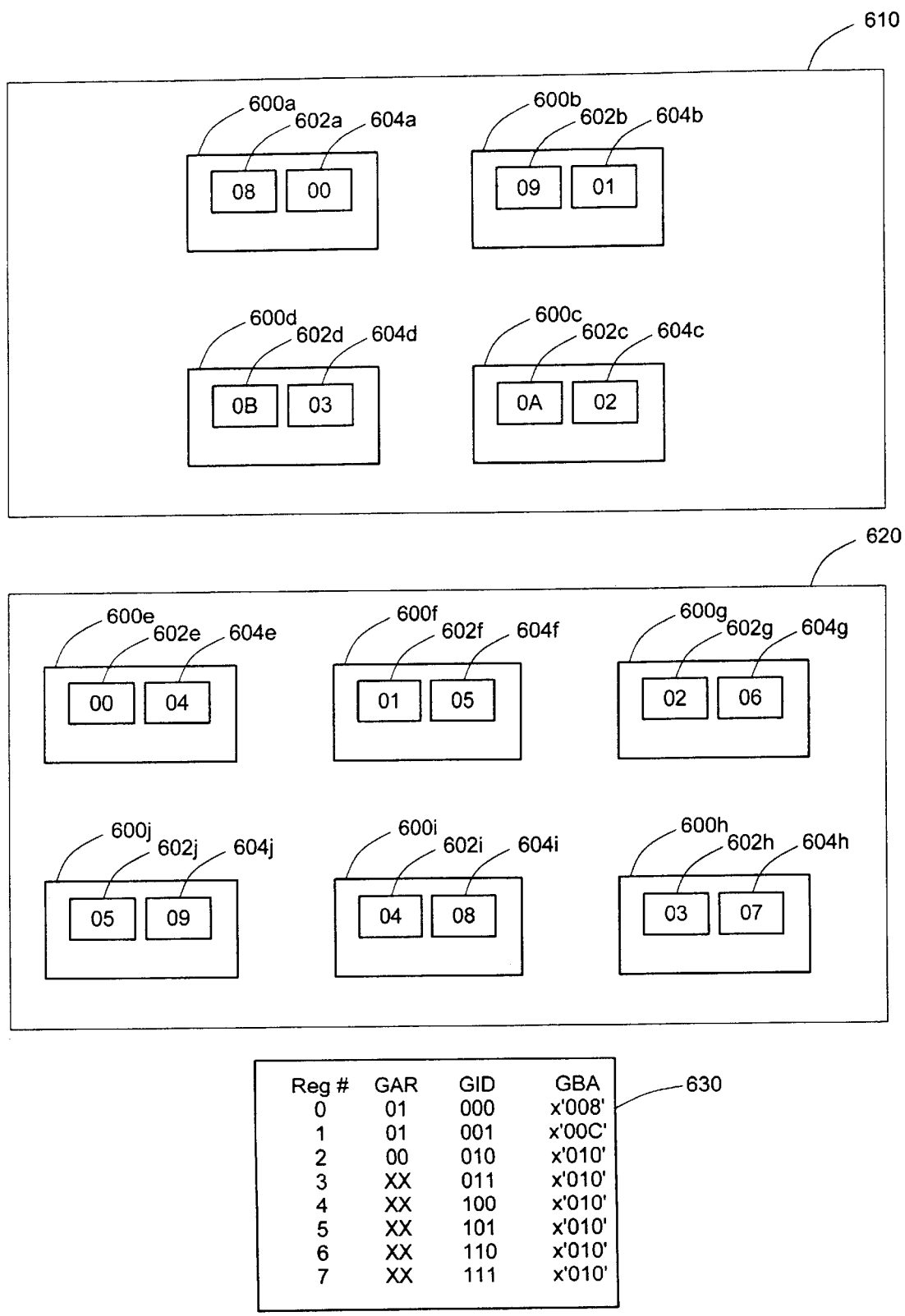

FIG. 6D shows the final state after the final step of initialization which sets all uninitialized GBAs to the value of the preceding GBA.

In memory subsystems that use multiple channels, such as the subsystem illustrated in FIG. 2, the initialization is performed on each memory channel as described above.

It will be understood by those skilled in the art that certain steps, particularly those relating to special conditions at the start and end of the initialization process have been omitted to avoid obscuring the principals of the invention and the process of initializing the memory address decode circuit. It will also be recognized that the steps of the initialization process can be carried out in different orders and otherwise modified in ways that will be understood by those skilled in the art within the spirit and scope of the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
  a plurality of group boundary address registers, each of the plurality of group boundary address registers holding a boundary value representing an uppermost address for one of a plurality of groups of memory devices, each of the memory devices in the group having the same configuration;
  a plurality of comparators, each comparator coupled to one of the plurality of group boundary address registers, each comparator receiving one of the plurality of group boundary values and a portion of a memory access address, and each comparator generating a comparison signal if the group boundary value is larger than the portion of the memory access address;
  a priority encoder coupled to the plurality of comparators to receive the plurality of comparison signals and generate a group number that represents an addressed group that contains an addressed memory device that contains the memory access address;
  a group attribute circuit coupled to the priority encoder that provides an attribute value for the memory devices in the addressed group; and
  a device selection circuit coupled to the priority encoder and the group attribute circuit that provides a device selection signal responsive to the group number and the attribute value.

2. The apparatus of claim 1 wherein the device selection circuit further provides a channel selection signal responsive to the group number.

3. The apparatus of claim 1 wherein the group attribute circuit further comprises a plurality of group attribute registers coupled to a 1 of n selector, each of the plurality of group attribute registers holding the attribute value for one of the plurality of groups of memory devices, the 1 of n selector providing the attribute value for the addressed group responsive to the group number.

4. The apparatus of claim 1 wherein the device section circuit further comprises a plurality of group identification registers coupled to a 1 of n selector, each of the plurality of group identification registers holding a portion of the device selection signal for one of the plurality of groups of memory devices, the 1 of n selector providing the portion of the device selection signal for the addressed group responsive to the group number.

5. The apparatus of claim 4 wherein each of the plurality of group identification registers further holds a channel selection signal for one of the plurality of groups of memory devices, the 1 of n selector providing the channel selection signal for the addressed group responsive to the group number.

6. The apparatus of claim 1 wherein each of the boundary values is a portion of the uppermost address plus one and the priority encoder generates a number of a lowest numbered group generating a comparison signal as the group number.

7. A memory subsystem comprising:
  a memory bus;
  a plurality of memory devices coupled to the memory bus;
  a memory control hub coupled to the memory bus, the memory control hub including
    a plurality of group boundary address registers, each of the plurality of group boundary address registers holding a boundary value representing an uppermost address for one of a plurality of groups of memory devices selected from the plurality of memory devices, each of the memory devices in the group having the same configuration,
    a plurality of comparators, each comparator coupled to one of the plurality of group boundary values, each comparator receiving one of the plurality of group boundary values and a portion of a memory access address, and each comparator generating a comparison signal if the group boundary value is larger than the portion of the memory access address,
    a priority encoder coupled to the plurality of comparators to receive the plurality of comparison signals and generate a group number that represents an addressed group that contains an addressed memory device that contains the memory access address,
    a group attribute circuit coupled to the priority encoder that provides a attribute value for the memory devices in the addressed group, and
    a device selection circuit coupled to the memory bus, the priority encoder and the group attribute circuit that provides a device selection signal on the memory bus responsive to the group number and the attribute value.

8. The memory subsystem of claim 7 wherein the device selection circuit further provides a channel selection signal on the memory bus responsive to the group number.

9. The memory subsystem of claim 7 wherein the group attribute circuit further comprises a plurality of group attribute registers coupled to a 1 of n selector, each of the plurality of group attribute registers holding the configuration value for one of the plurality of groups of memory devices, the 1 of n selector providing the attribute value for the addressed group responsive to the group number.

10. The memory subsystem of claim 7 wherein the device section circuit further comprises a plurality of group identification registers coupled to a 1 of n selector, each of the plurality of group identification registers holding a portion of the device selection signal for one of the plurality of groups of memory devices, the 1 of n selector providing the portion of the device selection signal for the addressed group responsive to the group number.

11. The memory subsystem of claim 10 wherein each of the plurality of group identification registers further holds a channel selection signal for one of the plurality of groups of memory devices, the 1 of n selector providing the channel selection signal for the addressed group responsive to the group number.

12. The memory subsystem of claim 7 wherein each of the boundary values is a portion of the uppermost address plus one and the priority encoder generates a number of a lowest numbered group generating a comparison signal as the group number.

13. A method comprising:
  loading a plurality of group boundary address registers, each of the plurality of group boundary address registers being loaded with a boundary value representing an uppermost address for one of a plurality of groups of memory devices, each of the memory devices in the group having the same configuration;
  receiving a memory access address;
  performing a plurality of comparisons between a portion of the memory access address and each of the plurality of boundary values to generate a comparison signal for each of the plurality of boundary values if the group boundary value is larger than the portion of the memory access address;
  priority encoding the plurality of comparison signals to generate a group number that represents an addressed group that contains an addressed memory device that contains the memory access address;

providing an attribute value for the memory devices in the addressed group responsive to the group number; and providing a device selection signal responsive to the group number and the attribute value.

14. The method of claim 13 further comprising providing a channel selection responsive to the group number.

15. The method of claim 13 wherein providing an attribute value further comprises selecting one of a plurality of stored attribute values responsive to the group number, each of the plurality of stored attribute values being the attribute value for one of the plurality of groups of memory devices.

16. The method of claim 13 wherein providing the device selection signal further comprises selecting one of a plurality of stored partial device selection signals responsive to the group number to provide a portion of the device selection signal, each of the plurality of stored partial device selection signals being the portion of the device selection signal for one of the plurality of groups of memory devices.

17. The method of claim 16 wherein each of the plurality of stored partial device selection signals further includes a channel selection signal for one of the plurality of groups of memory devices, the method further comprising providing the channel selection signal for the addressed group responsive to the group number.

18. The method of claim 13 wherein each of the boundary values is a portion of the uppermost address plus one and the priority encoding generates a number of a lowest numbered group generating a comparison signal as the group number.

19. A computer program embodied in data signals, the computer program comprising instructions for:

loading a plurality of group boundary address registers, each of the plurality of group boundary address registers being loaded with a boundary value representing an uppermost address for one of a plurality of groups of memory devices, each of the memory devices in the group having the same configuration;

receiving a memory access address;

performing a plurality of comparisons between a portion of the memory access address and each of the plurality of boundary values to generate a comparison signal for each of the plurality of boundary values if the group boundary value is larger than the portion of the memory access address;

priority encoding the plurality of comparison signals to generate a group number that represents an addressed group that contains an addressed memory device that contains the memory access address;

providing an attribute value for the memory devices in the addressed group responsive to the group number; and providing a device selection signal responsive to the group number and the attribute value.

20. The computer program of claim 19 further comprising providing a channel selection responsive to the group number.

21. The computer program of claim 19 wherein providing an attribute value further comprises selecting one of a plurality of stored attribute values responsive to the group number, each of the plurality of stored attribute values being the attribute value for one of the plurality of groups of memory devices.

22. The computer program of claim 19 wherein providing the device selection signal further comprises selecting one of a plurality of stored partial device selection signals responsive to the group number to provide a portion of the device selection signal, each of the plurality of stored partial device selection signals being the portion of the device selection signal for one of the plurality of groups of memory devices.

23. The computer program of claim 22 wherein each of the plurality of stored partial device selection signals further includes a channel selection signal for one of the plurality of groups of memory devices, the method further comprising providing the channel selection signal for the addressed group responsive to the group number.

24. The computer program of claim 19 wherein the data signals are signals embodied in a computer memory, signals embodied on computer-readable media, or signals embodied in a carrier wave.

* * * * *